(12) United States Patent
Kobayashi

(10) Patent No.: US 6,590,455 B1
(45) Date of Patent: Jul. 8, 2003

(54) COMMON-BASE AMPLIFIER WITH HIGH INPUT OVERLOAD AND/OR TUNABLE TRANSIMPEDANCE

(75) Inventor: Kevin W. Kobayashi, Torrance, CA (US)

(73) Assignee: Sirenza Microdevices, Inc., Sunnyvale, CA (US)

( * ) Notice: Subject to any disclaimer, the term of this patent is extended or adjusted under 35 U.S.C. 154(b) by 0 days.

(21) Appl. No.: 10/132,351

(22) Filed: Apr. 25, 2002

(51) Int. Cl.$^7$ ................................................ H03F 3/08
(52) U.S. Cl. ........................ 330/308; 330/110; 330/305; 250/214 A
(58) Field of Search ................................ 330/110, 305, 330/308; 250/214 A (56) References Cited

U.S. PATENT DOCUMENTS

| | | | |
|---|---|---|---|
| 5,216,386 A | * | 6/1993 | Wyatt .......................... 330/308 |
| 6,069,534 A | * | 5/2000 | Kobayashi ................... 330/308 |
| 6,404,281 B1 | | 6/2002 | Kobayashi ................... 330/85 |

OTHER PUBLICATIONS

"Wide–Band Integrated Optical Receiver with Improved Dynamic Range Using a Current Switch at the Input", By L.A.D. van den Broeke and A.J. Nieuwkerk, IEEE Journal of Solid–State Circuits, vol. 28, No. 7, Jul. 1993, pp. 862–864.

"Integrated High Frequency Low–Noise Current–Mode Optical Transimpedance Preamplifiers: Theory and Practice", By Tongtod Vanisri and Chris Toumazou, IEEE Journal of Solid–State Circuits, vol. 30, No. 6, Jun. 1995, pp. 677–685.

Kobayashi, Kevin W., "Method and/or Apparatus for Controlling a Common–Base Amplifier", U.S. Ser. No. 10/123,503, Filed Apr. 16, 2002.

* cited by examiner

Primary Examiner—Henry Choe
(74) Attorney, Agent, or Firm—Christopher P. Maiorana, P.C.

(57) ABSTRACT

An apparatus comprising a common-base amplifier circuit and a control circuit. The amplifier circuit may be configured to generate an output signal having a transimpedance bandwidth in response to an input signal. The control circuit may be (i) coupled between the output signal and the input signal and (ii) configured to implement input signal control to provide input overload current capability.

19 Claims, 15 Drawing Sheets

(CONVENTIONAL)

FIG. 1

FIG. 2
(CONVENTIONAL)

(CONVENTIONAL)

FIG. 3

FIG. 4 (CONVENTIONAL)

FIG. 5 (CONVENTIONAL)

FIG. 6 (CONVENTIONAL)

COMMON-BASE AMPLIFIER WITH HIGH INPUT OVERLOAD AND/OR TUNABLE TRANSIMPEDANCE

FIELD OF THE INVENTION

The present invention relates to a method and/or architecture for implementing amplifiers generally and, more particularly, to a method and/or architecture for implementing a common-base amplifier with a high input overload capability and/or tunable transimpedance.

BACKGROUND OF THE INVENTION

One conventional approach for tuning the transimpedance response of an amplifier is to change the bias current of a common-base input stage. Varying the bias current varies the complex input impedance and voltage gain which changes the overall transimpedance response. However, dramatic changes in the bias current can profoundly change the overload capability of the transimpedance amplifier (TIA). In general, a peaked response is often due to wire-bond parasitics which can result in intersymbol interference (ISI). Such parasitics can be suppressed by reducing the bias current and effective input inductance of a common-base input stage. However, reducing the bias current can severely degrade overload performance. In order to satisfy the need for high current overload capability, a number of approaches for implementing common-base transimpedance pre-amplifier topologies are commonly used.

One such conventional approach is the implementation of common-base input stages that are capable of high input currents (e.g., Vanisri, Tongtod, Toumazou, Chris, "Integrated High Frequency Low-Noise Current-Mode Optical Transimpedance Preamplifiers: Theory and Practice", IEEE JSSSC, vol. 30, no. 6, June, 1995, pp. 677–685). However, such circuits are biased with a collector current that equals or exceeds the overload current condition. Such an approach typically results in significant shot noise degradation and potential transimpedance gain-bandwidth degradation.

Another conventional common-base approach for improving overload current performance is to use a common-base differential switch to switch between a successive amplifier and the direct output based on the detected received power level (e.g., Van den Broeke, L. A. D., and Nieuwkerk, A. J., "Wide-Band Integrated Optical Receiver with Improved Dynamic Range Using a Current Switch at the Input", IEEE JSSSC, vol. 28, no. 7, July 1993, pp. 862–864).

Figure 1:
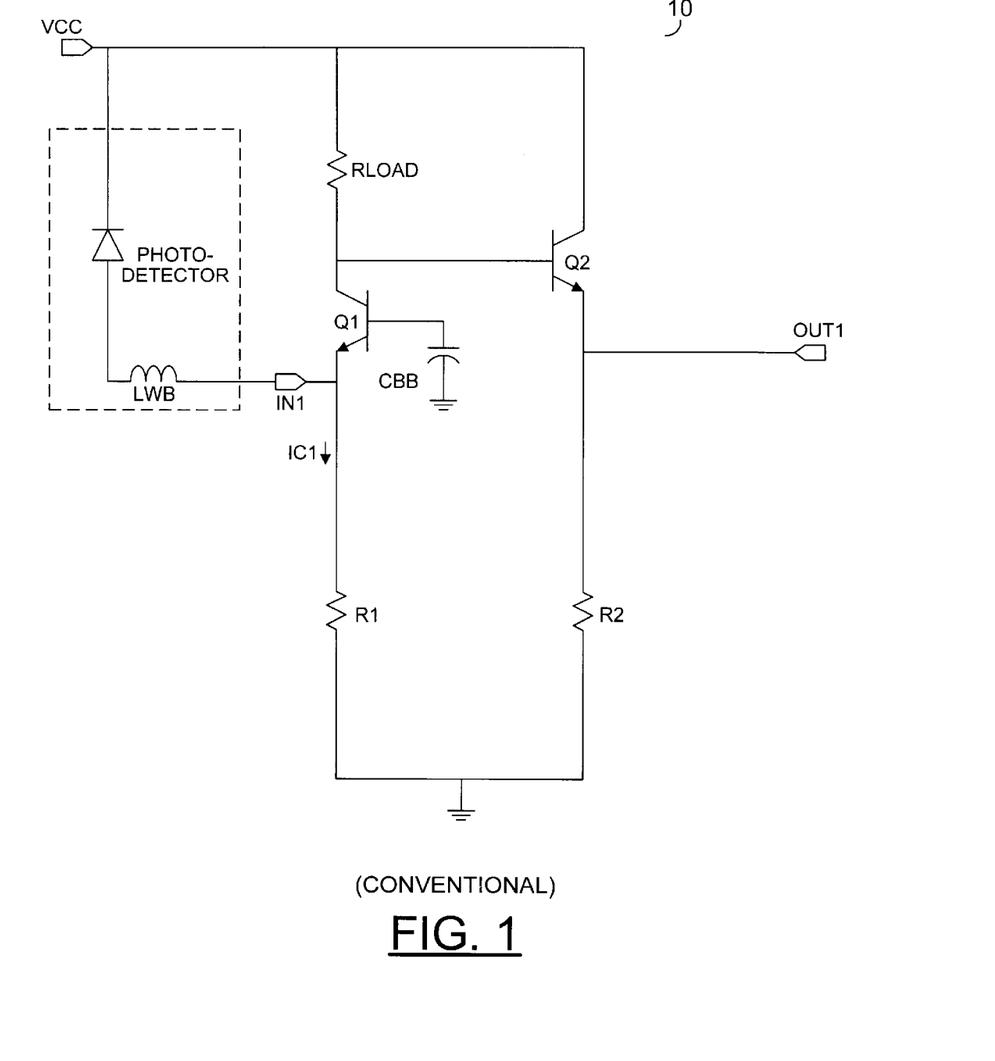
FIG. 1 is a diagram of a conventional common-base input stage of a conventional approach.

Referring to FIG. 1, a circuit 10 is shown implementing a conventional common-base input stage. The common-base input allows high input overload capability. However, increasing the current Ic1 such that the current Ic1>an Overload current (Ioverload) specification (typically>2 mA) can result in higher input referred shot noise (i.e., 2qIc1). In addition, higher current Ic1 can result in a peaked transimpedance response which can introduce undesirable noise, large signal transient distortion, and potential instability. However, the current Ic1 must be set>Ioverload (2 mA) in order to maintain low TIA distortion.

Figure 2:
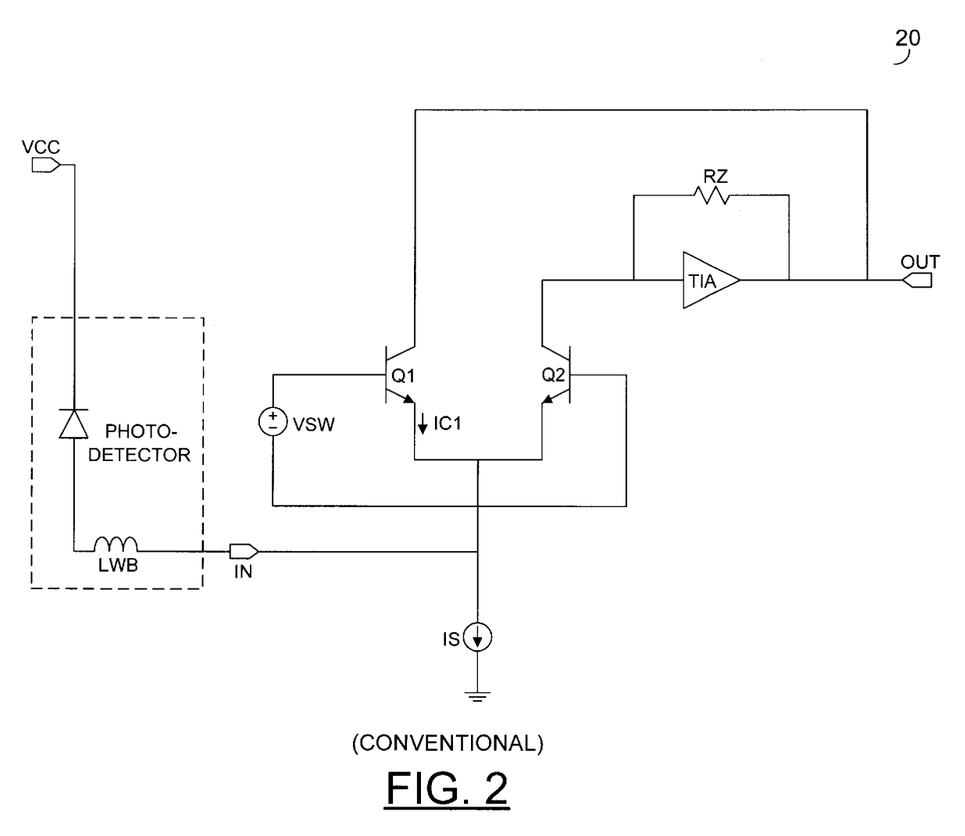
FIG. 2 is a diagram of another common-base input stage of a conventional approach.

Referring to FIG. 2, a circuit 20 is shown implementing another conventional common-base input stage. A common-base differential input is used to switch the input to either (i) a direct output when a high input current is detected, or (ii) a successive TIA amplifier when a low input current is detected. However, as in other conventional common-base stages, a high DC collector current Ic1, greater than the maximum signal current (2 mA), is maintained in order to avoid signal clipping at the input. As in the circuit 10, additional noise and transimpedance-bandwidth peaking distortion can result.

Figure 3:
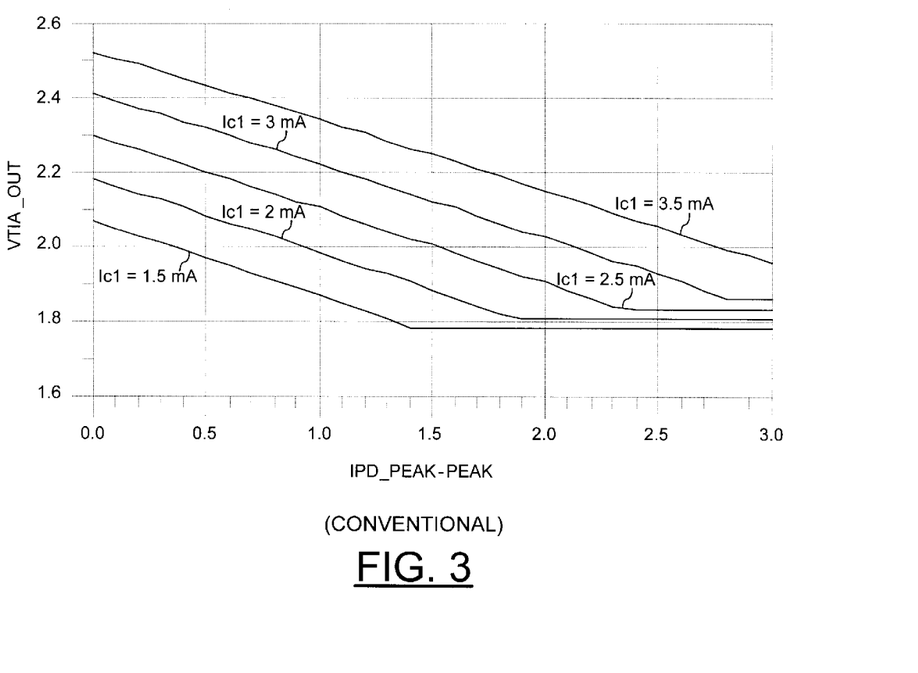
FIG. 3 is a diagram illustrating the DC overload performance of a conventional design.

Referring to FIG. 3, a DC overload performance of a conventional common-base TIA design is shown. A CB collector bias current of 1.5 mA only provides about 1.4 mA of overload current capability before the output voltage clips. In order to obtain high overload current from a common-base TIA, the quiescent collector current of the common-base transistor must be greater than the maximum input current seen by the TIA of the circuit 20 of Van den Broeke. FIG. 3 shows the DC output voltage versus peak input current Ipd-peak for various common-base collector biases Ic1. High overload is obtained at higher collector biases. However, higher collector current bias also increases noise, gain peaking, large signal overshoot distortion, and potential circuit instability.

Figure 4:
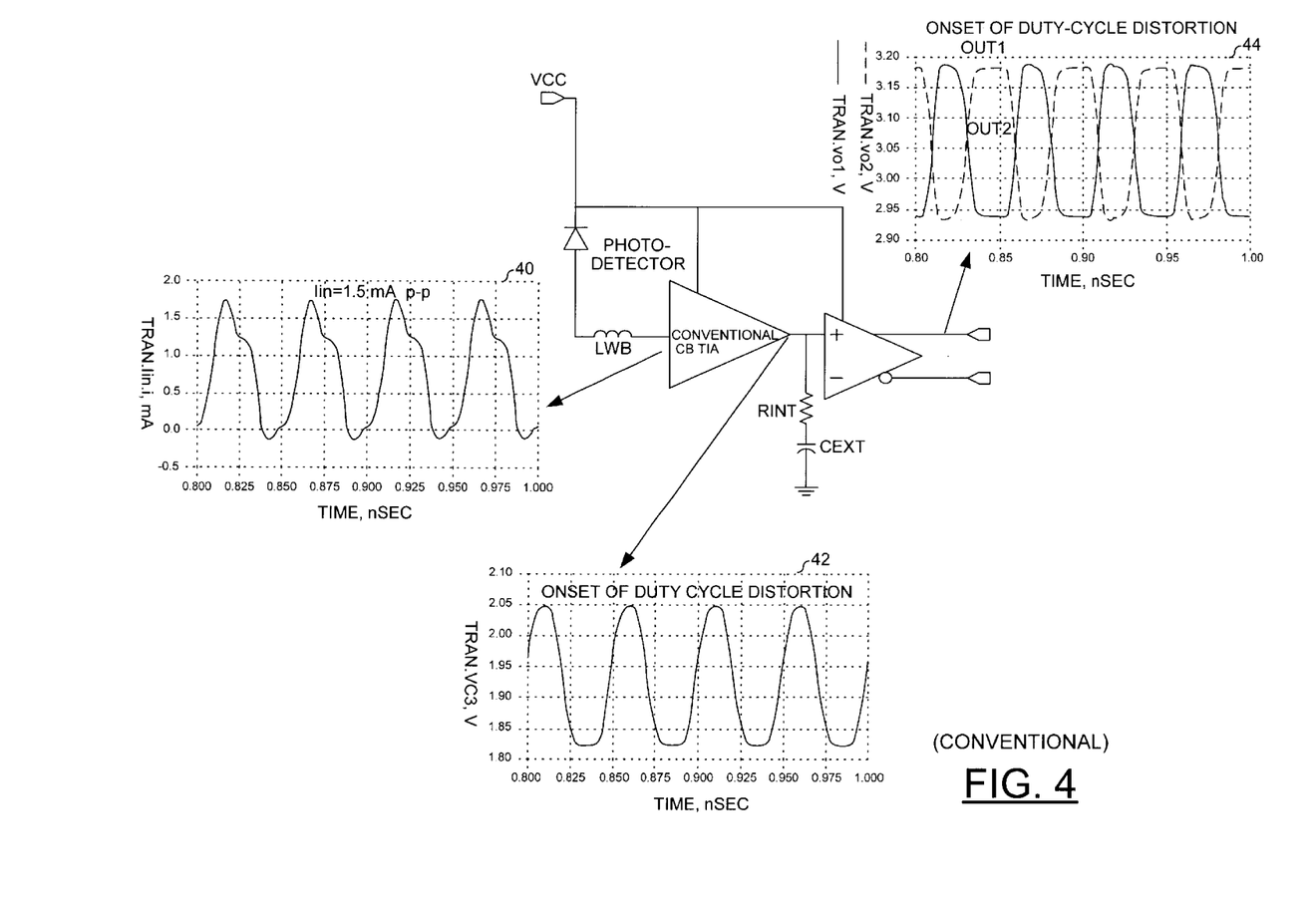
FIG. 4 is a diagram of overload performance of a conventional approach (Iin=1.5 mA p-p)

Referring to FIG. 4, an Overload Performance with an input current Iin=1.5 mA p-p for a conventional CB design (Ic1=1.5 mA) is shown. The waveform 40 illustrates the input current Iin (Ipd-peak). The waveform 42 illustrates the onset of duty cycle distortion at the output of the pre-amplifier stage. The waveform 44 illustrates the onset of duty cycle distortion at the output.

Figure 5:
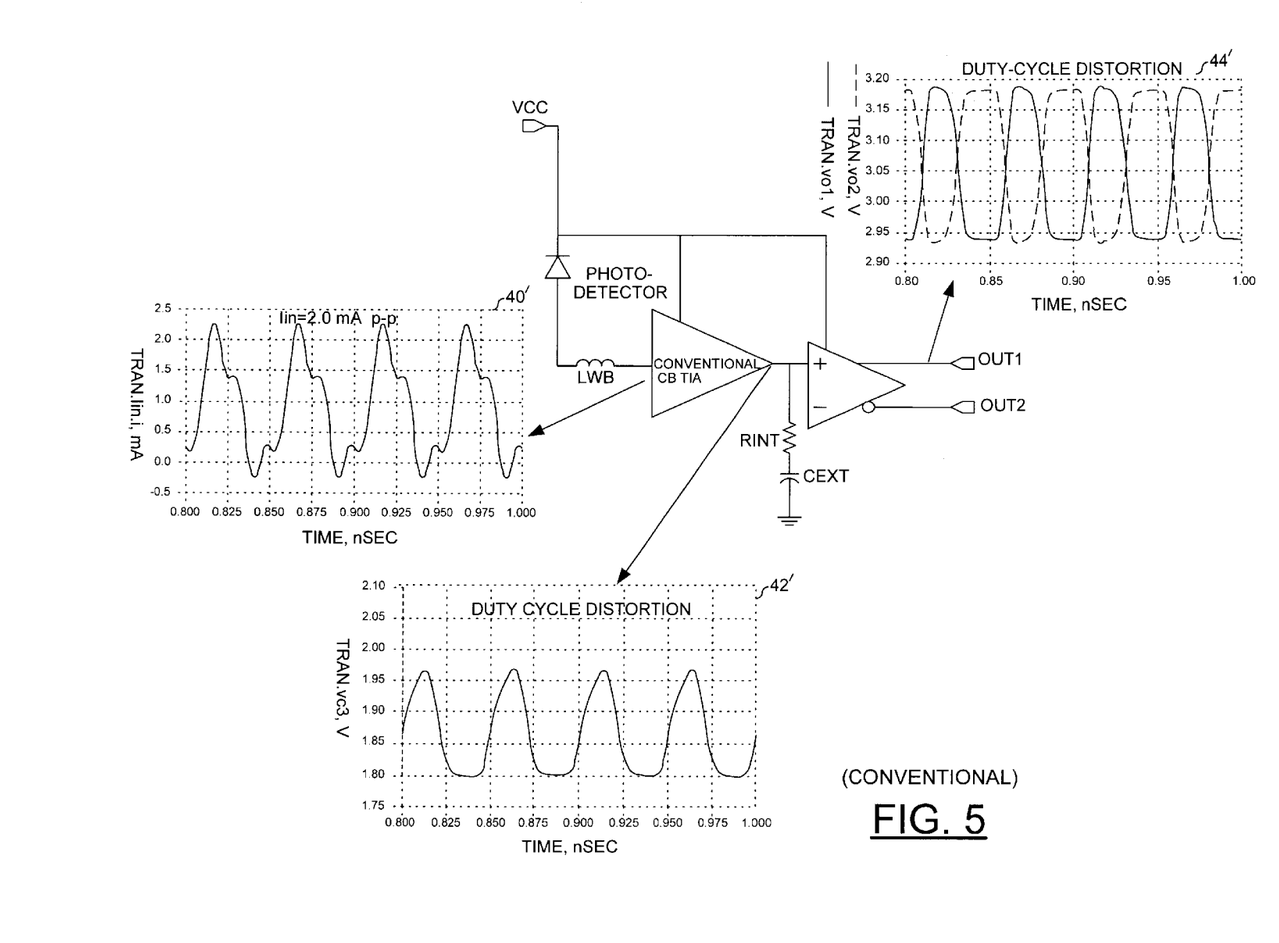
FIG. 5 is a diagram of overload performance of a conventional approach (Iin=2 mA p-p)

Referring to FIG. 5, an Overload Performance with an input current Iin=2 mA p-p for a conventional CB design (Ic1=1.5 mA) is shown. The waveform 40' illustrates the input current Iin (Ipd-peak). The waveform 42' illustrates significant duty cycle distortion at the output of the pre-amplifier stage. The waveform 44' illustrates significant duty cycle distortion at the output.

Figure 6:
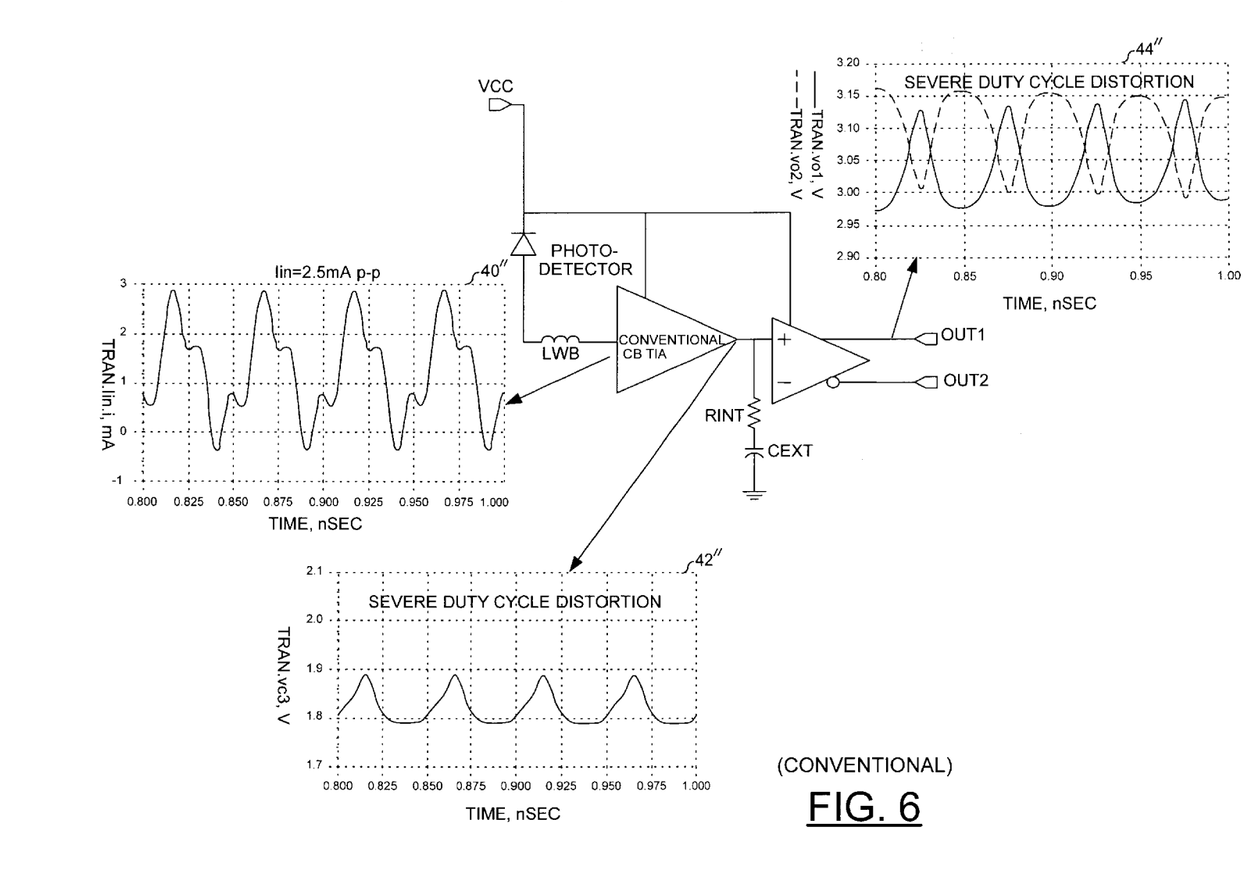
FIG. 6 is a diagram of overload performance of a conventional approach (Iin=2.5 mA p-p)

Referring to FIG. 6, an Overload Performance with an input current Iin=2.5 mA p-p for a conventional CB design (Ic1=1.5 mA) is shown. The waveform 40" illustrates the input current Iin (Ipd-peak). The waveform 42" illustrates severe duty cycle distortion at the output of the pre-amplifier stage. The waveform 44" illustrates severe duty cycle distortion at the output.

It would be desirable to implement a transimpedance amplifier that enables the transimpedance response to be tuned without substantially compromising overload performance.

SUMMARY OF THE INVENTION

The present invention concerns an apparatus comprising a common-base amplifier circuit and a control circuit. The amplifier circuit may be configured to generate an output signal having a transimpedance bandwidth in response to an input signal. The control circuit may be (i) coupled between the output signal and the input signal and (ii) configured to implement input signal control to provide input overload current capability.

The objects, features and advantages of the present invention include implementing a common-base amplifier with high input overload and tunable transimpedance that may (i) implement high dynamic range transimpedance amplifiers (TIAs) that may be suitable for next generation 10 Gb/s and 40 Gb/s optical receiver applications, (ii) provide state of the art transimpedance amplification for avalanche photodiodes (APDs) and heterojunction photo-transistors (HPTs) with responsivities in a range of 1–10 A/W p-p, (iii) have an overload specification that may be more aggressive than those imposed by typical 10 Gb/s positive-intrinsic-negative (PIN) diode technologies, and/or (iv) provide a TIA which may handle high overload currents (e.g., as defined by a particular design specification) while maintaining low duty cycle and overshoot distortion (e.g., as defined by a particular design specification).

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention concerns an amplifier (e.g., a Single-ended Common-base (CB) transimpedance amplifier (TIA)), with high overload current capability. The present invention may reduce the duty cycle distortion of a single-ended common-base TIA as the optical input power of the receiver is increased when the present invention is implemented in a photo-detector application (e.g., a fiber optic receiver), while maintaining a low common-base collector bias current. The present invention may allow high overload performance without significantly compromising sensitivity, bandwidth, or increasing power consumption. The present invention may also allow an electronically tunable transimpedance bandwidth response of a common-base TIA without significantly compromising overload capability.

The present invention may implement a compensation (e.g., feedback and control) loop which is generally directly applied to a common-base input stage that precedes a TIA or pre-amplifier. The compensation loop may provide enhanced input overload current performance without implementing a large quiescent collector current bias (such quiescent collector currents can degrade noise, introduce peaking and overshoot distortion, and generate potential instability in the circuit). Moreover, the present invention enables transimpedance tuning of the common-base input stage by adjusting the bias current (e.g., Ic1) without significantly compromising overload capability as in the conventional CB design.

Figure 7:
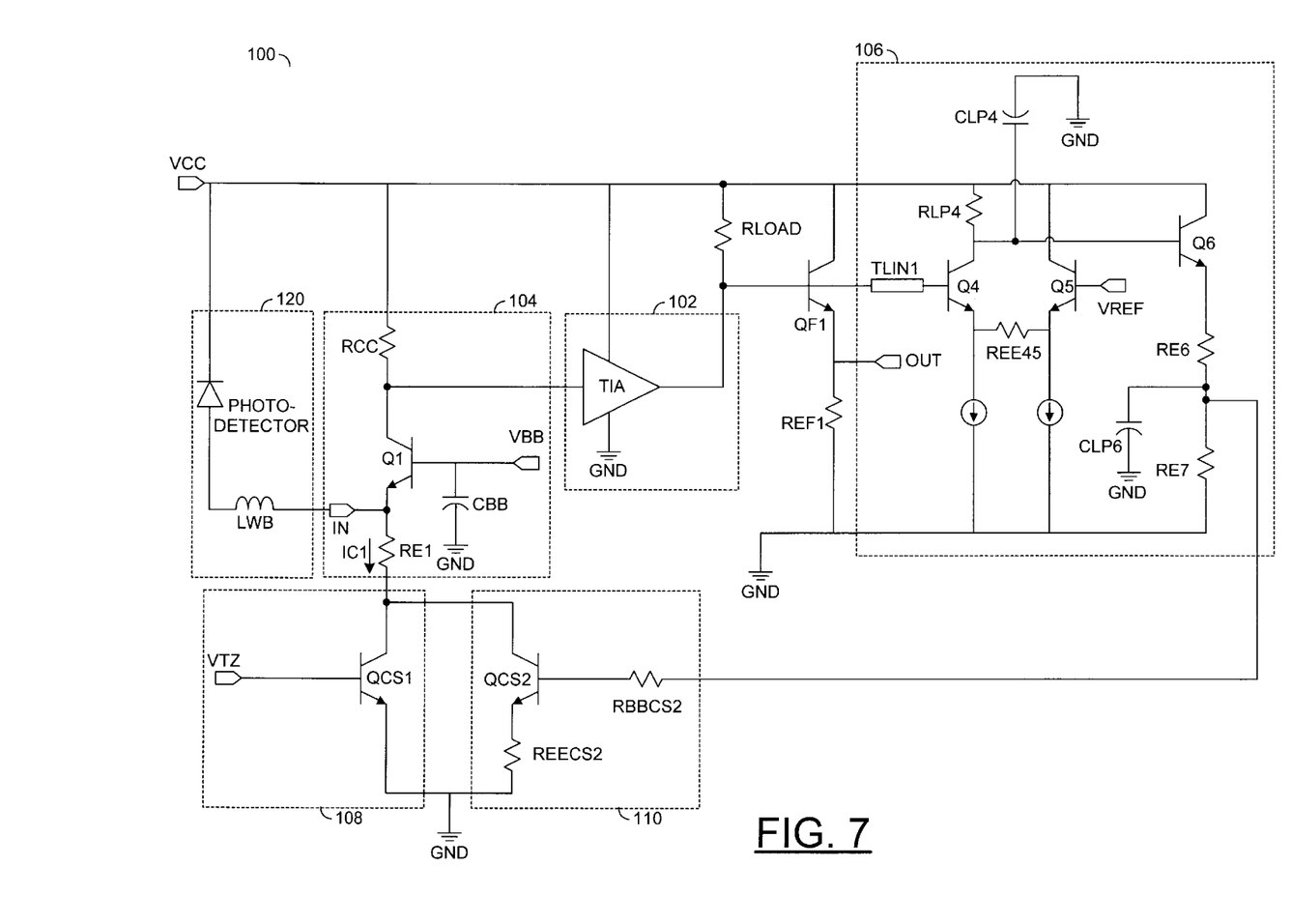
FIG. 7 is a diagram of a preferred embodiment of the present invention.

Referring to FIG. 7, a circuit 100 is shown in accordance with a preferred embodiment of the present invention. The circuit 100 generally comprises a block (or circuit) 102, a block (or circuit) 104, a block (or circuit) 106, a block (or circuit) 108 and a block (or circuit) 110. The circuit 102 generally comprises a transimpedance amplifier. In general, the circuit 102 may be implemented as a single-ended transimpedance amplifier. The circuit 104 may be implemented as a common-base input circuit. The circuit 106 may be implemented as a detection-integration circuit. The circuit 108 may be implemented as a tuning circuit. The circuit 110 may be implemented as a overload compensation circuit.

The circuit 104 generally comprises a resistor Rcc, a resistor Re1, a transistor Q1 and a capacitor Cbb. An input signal (e.g., IN) may be presented between the emitter of the transistor Q1 and the resistor Re1. The collector load resistor Rcc may be connected between a supply voltage (e.g., Vcc) and a collector of the transistor Q1. The input signal IN may be received from a photo-detector 120. The photo-detector 120 may be implemented as an optical device such as a photo-diode. A base bias voltage signal (e.g., Vbb) may be presented to the base of the transistor Q1. The collector of the transistor Q1 may be connected to an input of the amplifier 102. The signal Vbb may be generated by a conventional voltage reference circuit or a bandgap reference circuit.

The TIA 102 may have an output that is connected to a base of an emitter follower buffer transistor Qf1 and an isolation element TLin1 of the circuit 106. The transistor Qf1 may have a collector that is connected to the supply voltage Vcc and an emitter that may present an output signal (e.g., OUT). A load resistor RLOAD may be connected between the base of the transistor Qf1 and the supply voltage Vcc. A bias resistor Ref1 may be connected between the emitter of the transistor Qf1 and a ground potential (e.g., GND).

The detection/integration circuit 106 generally comprises a transistor Q4, a transistor Q5 and a transistor Q6. A reference voltage (e.g., Vref) may be presented to (e.g., provide a bias signal to) the base in the transistor Q5. The base of the transistor Q4 may be connected to the transmission line (or resistor) Tlin1. A resistor Ree45 may be connected between the emitters of the transistors Q4 and Q5., A resistor Rlp4 is generally connected between the collector of the transistor Q4 and the supply voltage Vcc. A capacitor Clp4 is generally connected between a (i) node at the collector of the transistor Q4 and the base of the transistor Q6 and (ii) the ground potential GND. A resistor Re6 and a resistor Re7 may form a voltage divider between the emitter of the transistor Q6 and the ground potential GND. A capacitor Clp6 is generally connected between a node between the resistors. Re6 and Re7 and the ground potential GND. The node between the resistors Re6 and Re7 is also connected to the circuit 110.

The circuit 108 generally comprises the transistor Qcs1. The base of the transistor Qcs1 may receive a signal (e.g., VTZ). The collector of the transistor Qcs1 may be connected to the. resistor Re1 of the circuit 104. The emitter of the transistor Qcs1 is generally connected to the ground potential GND. The signal VTZ may be a control signal that is implemented to adjust the transimpedance bandwidth (Tz-Bw) of the circuit 100.

The circuit 110 generally comprises a transistor Qcs2. The collector of the transistor Qcs2 is generally connected to the collector of the transistor Qcs1. The emitter of the transistor Qcs2 is generally connected to ground VGD through a resistor Reecs2. A resistor Rbbcs2 may be connected between a base of the transistor Qcs2 and the capacitor Clp6 of circuit 106. The circuit 110 may provide a control (e.g., feedback) loop that may provide overload compensation to the circuit 100.

The circuit 100 will typically be directly cascaded to one or more differential limiting output stages (to be described in more detail in connection with FIG. 10). The photo-diode/photo-detector 120 is generally coupled to an input (e.g., the input IN). The output port (e.g., OUT) of the circuit 100 is generally connected to one of the two input ports of the successive differential limiting amplifier (as described in FIG. 10). The photo-detector device 120 typically presents an impedance of a small (e.g., generally less than 1 pf) capacitor in series with a contact resistor.

An inductor (e.g., LWB), generally represents a finite parasitic inductance between the photo-detector 120 and the input IN of the circuit 104. The particular value of the inductor LWB is not well know in advance, and can vary from module to module. Since the inductor LWB is generally part of the input impedance (e.g., Zin) of the amplifier 102, the transimpedance-BW response will be directly affected by the value of the inductance LWB.

The emitter input IN of the common-base transistor Q1 generally resembles an active inductor having a value that may be bias dependent. By providing the biasing tuning voltage signal VTZ, the total series input inductance Zin (which includes the inductance LWB) to the amplifier 102 may be tailored and fine tuned in order optimize the transimpedance-BW response after the optical sub-assembly where the circuit 100 is implemented has been manufactured. Such tuning may provide the elimination of mechanical hybrid tuning and the associated assembly/labor costs.

Figure 8:
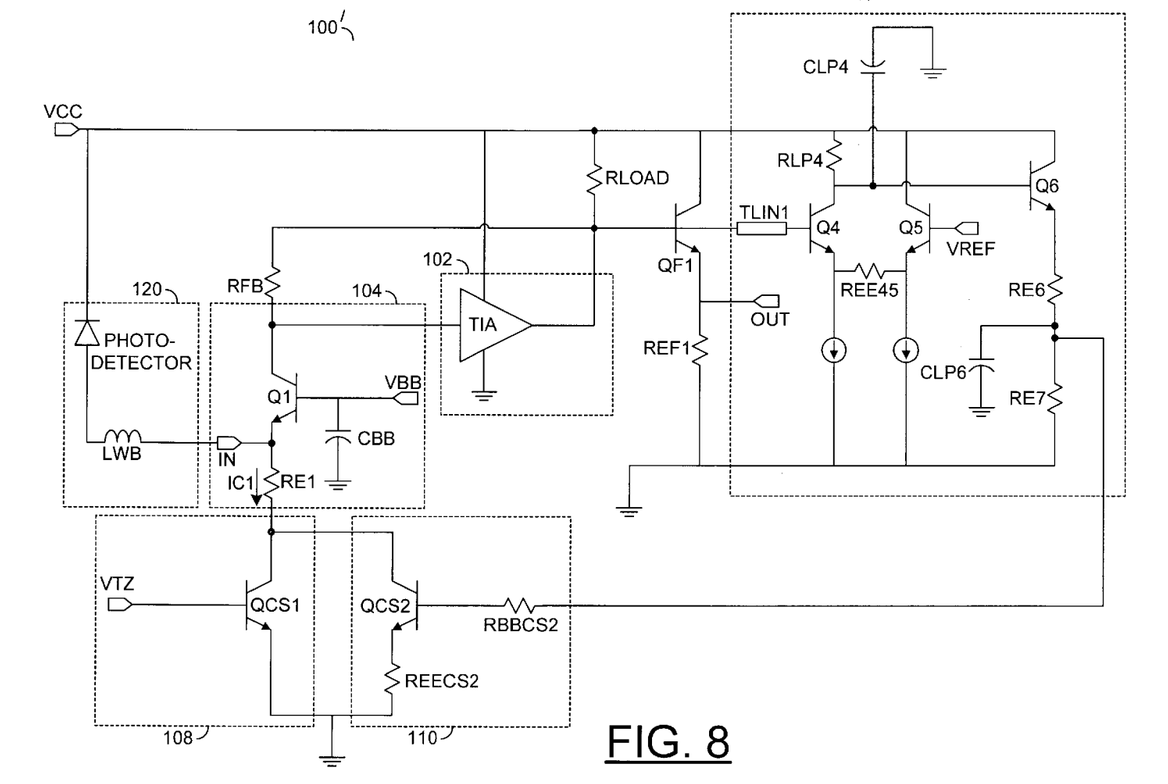
FIG. 8 is an alternate embodiment of the present invention.

Referring to FIG. 8, a circuit 100' is shown implementing an alternate embodiment of the present invention. A resistor RFB is shown replacing the resistor Rcc of FIG. 7. The resistor RFB is generally connected to the output of the amplifier 102. While illustrated as a TIA, in this embodiment, the circuit 102 may comprise a discrete gain block 102 instead of a TIA 102, as shown in FIG. 7. The embodiment of the circuit 100' may be configured as a general application having gain block circuits by implementing the feedback resistor RFB.

Figure 9:
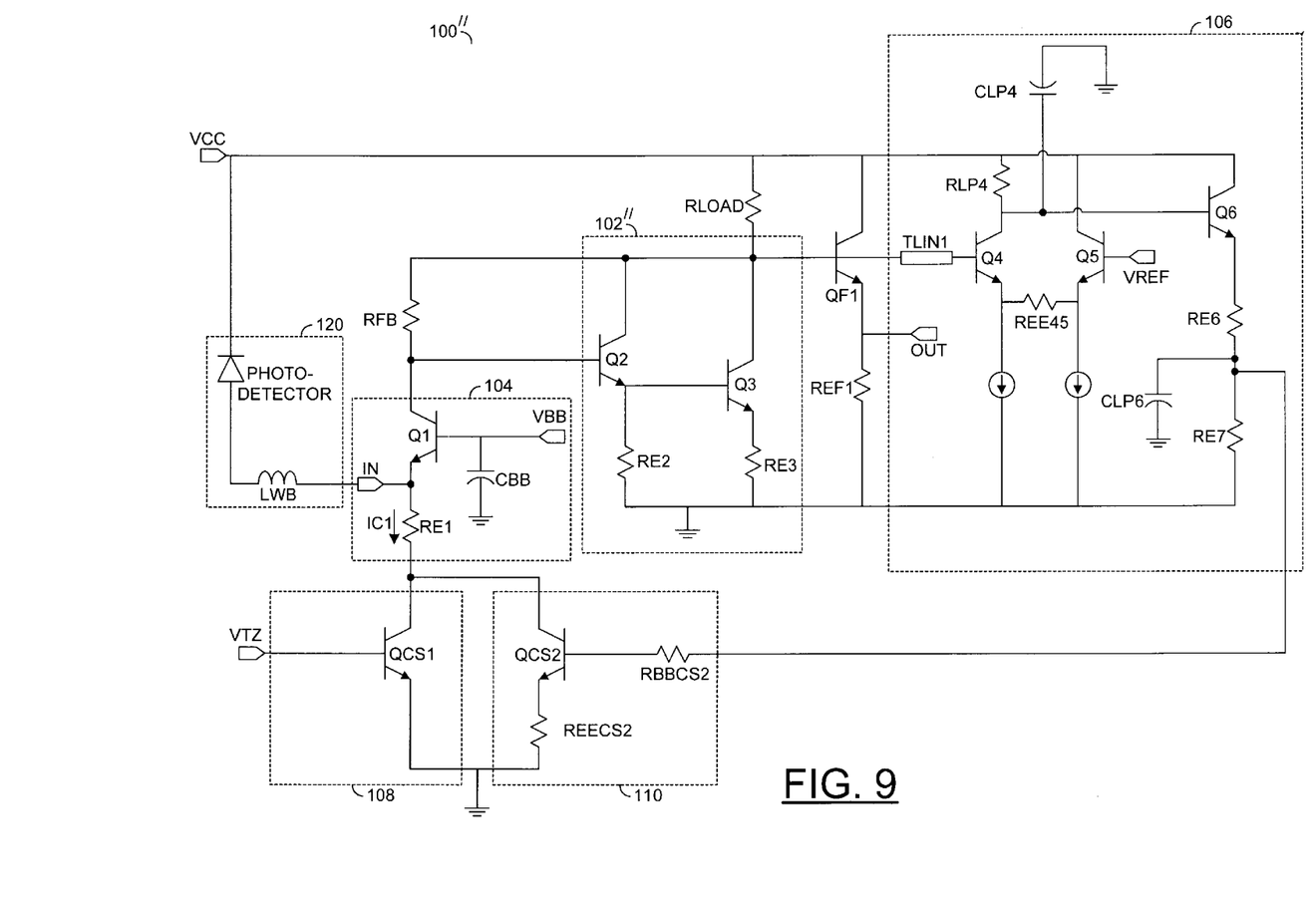
FIG. 9 is another alternate embodiment of the present invention.

Referring to FIG. 9, a circuit 100" is shown implementing another alternate embodiment of the present invention. The amplifier 102" is shown implemented with discrete components. For example, the amplifier 102" is shown implemented as a transistor Q2, a transistor Q3, a resistor RE2, a resistor RE3 connected in a Darlington configuration. The amplifier 102" is shown directly connected to the circuit 106. This embodiment shows one specific application to a Darlington gain block.

Figure 10:
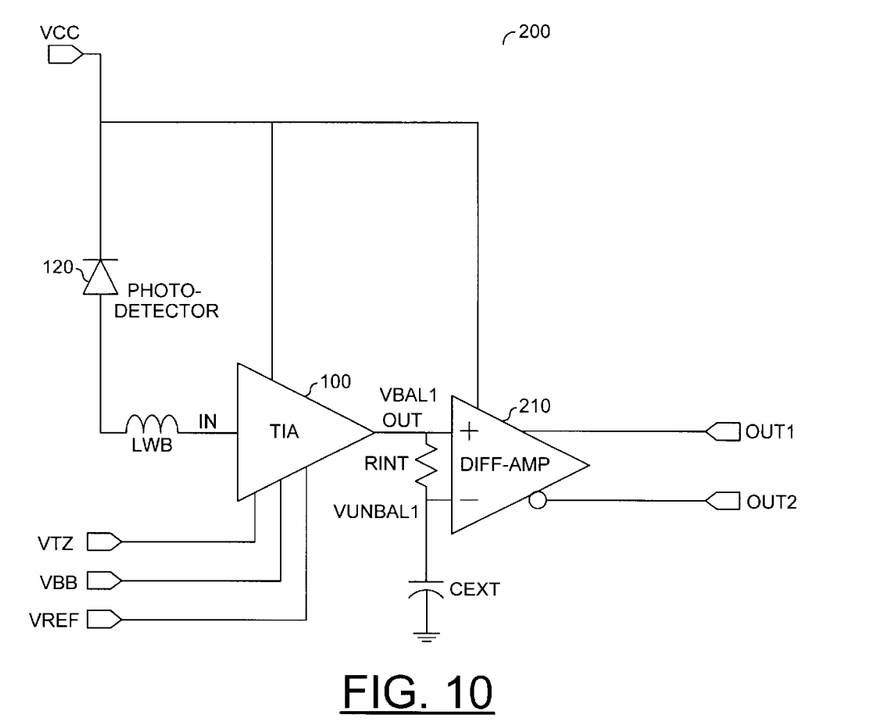
FIG. 10 illustrates a context of the present invention.

Referring to FIG. 10, a circuit 200 is shown implementing the context of the present invention. The circuit 100 is shown cascaded with a differential amplifier 210. The differential amplifier 210 may be used to provide single-ended to differential conversion. Any number of circuits 210 may be cascaded with the circuit 100 to meet the design criteria of a particular application.

Figure 11:
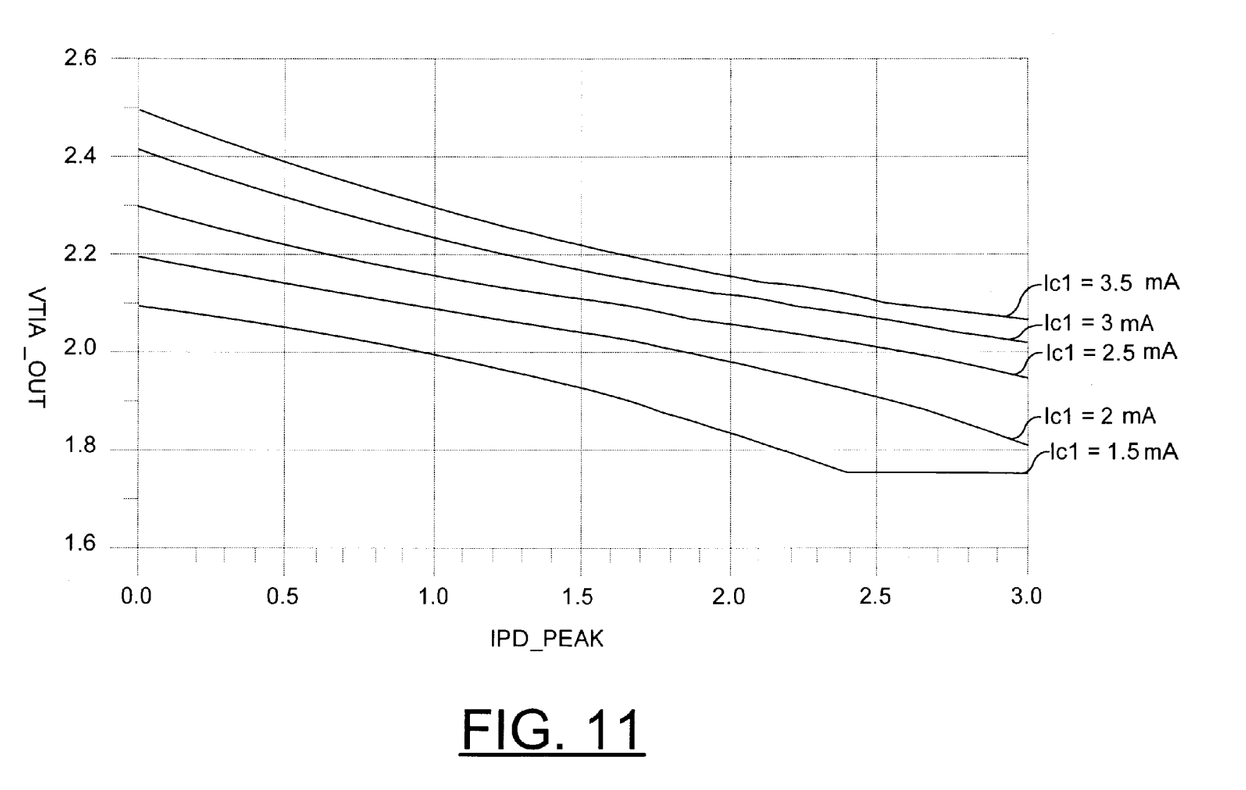
FIG. 11 illustrates the DC overload performance of the present invention.

Referring to FIG. 11, the DC Overload Performance of the present invention is shown. The present invention may allow overload current of up to 2.4 mA with a 1.5 mA collector current bias Ic1. This is generally a 4.7 dB improvement over the conventional common-base design performance shown n FIG. 3. The circuit 100 generally restores the bias of the CB input stage as peak-peak input photo current Ipd-peak is increased. An increase in current overload capability may be obtained for a given quiescent collector current bias Ic1. For example, the circuit 100 generally allows the CB stage 104 biased at Ic1=1.5 mA to achieve 2.4 mA of input overload current Ipd-peak before clipping. By comparison, the conventional common-base TIA discussed in the background section yield 1.4 mA p-p input overload before signal clipping.

Figure 12:
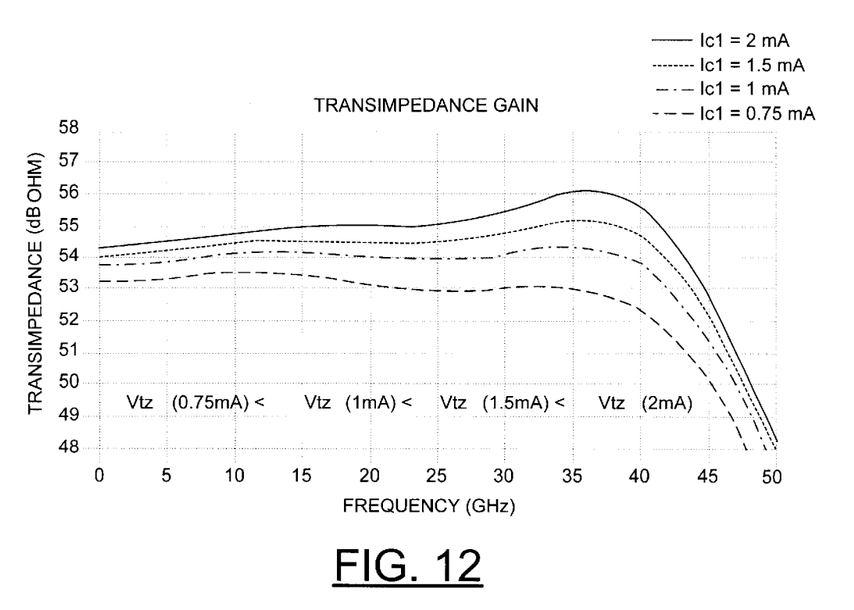
FIG. 12 illustrates the transimpedance gain versus frequency as a function of collector current.

Referring to FIG. 12, a tunable transimpedance-BW performance as a function of the bias Ic1 through the transistor Q1 is shown. The transimpedance-BW shape may be tuned by adjusting the voltage signal VTZ, which generally controls the amount of current Ic1 flowing through the common-base stage 104. The graph shows that the transimpedance-BW response can be shaped by changing the collector current bias Ic1 of the CB input stage 104. The shaping can be achieved by changing the voltage VTZ which changes the amount of current through the current source bias transistor Qcs1 of the circuit 108.

As the current Ic1 is increased, the upper band response begins to peak, which increases the circuit 100 bandwidth. Too much collector current can result in excessive peaking and overshoot distortion even though the overload capability improves. Conventional designs have a conflicting requirement between high overload (high Ic1) and flat transimpedance BW (low Ic1). The circuit 100 of the present invention alleviates the conflict problem by providing a combination of overload and Tz-BW simultaneously, by allowing high overload at modest CB bias currents (e.g., Ic1 is generally less than 2 mA).

Figure 13:
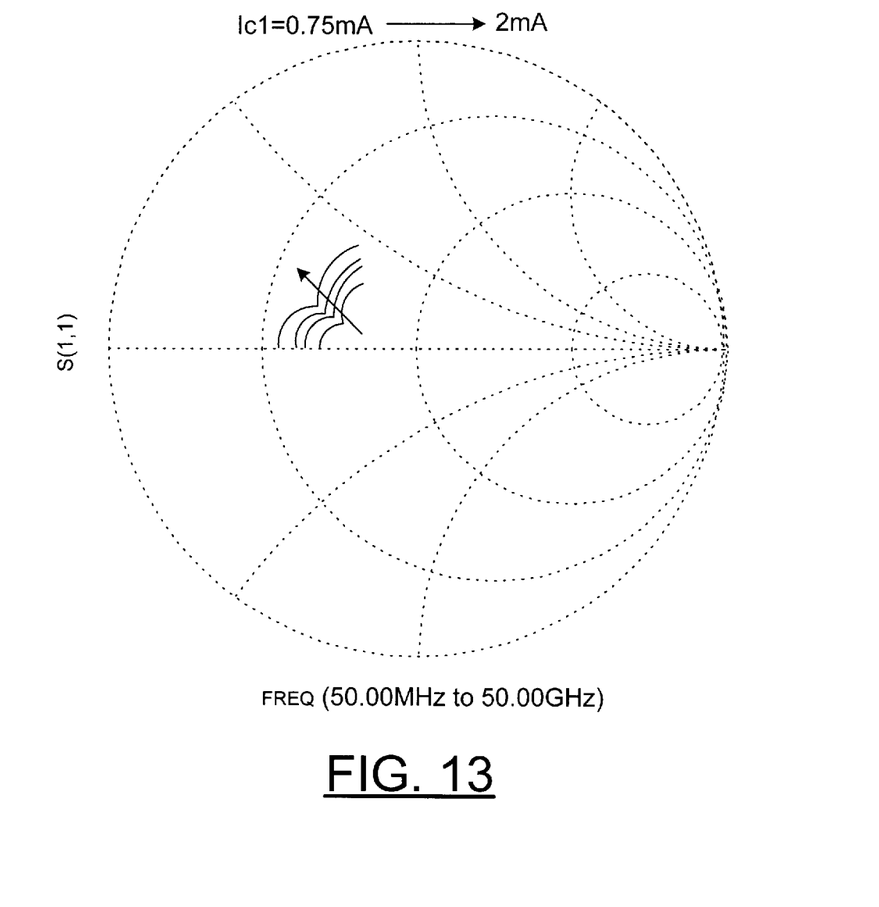
FIG. 13 illustrates the tunable input impedance as a function of common-base collector current.

Referring to FIG. 13, a Smith chart of a tunable input impedance as a function of common-base collector current bias Ic1 is shown. As the voltage VTZ increases, the current Ic1 increases, and the input impedance of the CB transistor Q1 appears more inductive when looking into the emitter. Conversely, for a lower voltage VTZ, the input inductance can be decreased.

The present invention allows tuning of the input impedance Zin of the common-base stage 104 to be electronically tuned by the voltage VTZ which changes the effective bias current Ic1 of the common-base input transistor Q1. The tuning may be used to compensate for the parasitic wirebond inductance LWB which attaches the TIA 100 die to an external photo-diode 120 die. The tuning provides a method and/or architecture to recover transimpedance bandwidth after the integrated receiver where the circuit 100 is implemented is assembled.

Figure 14:
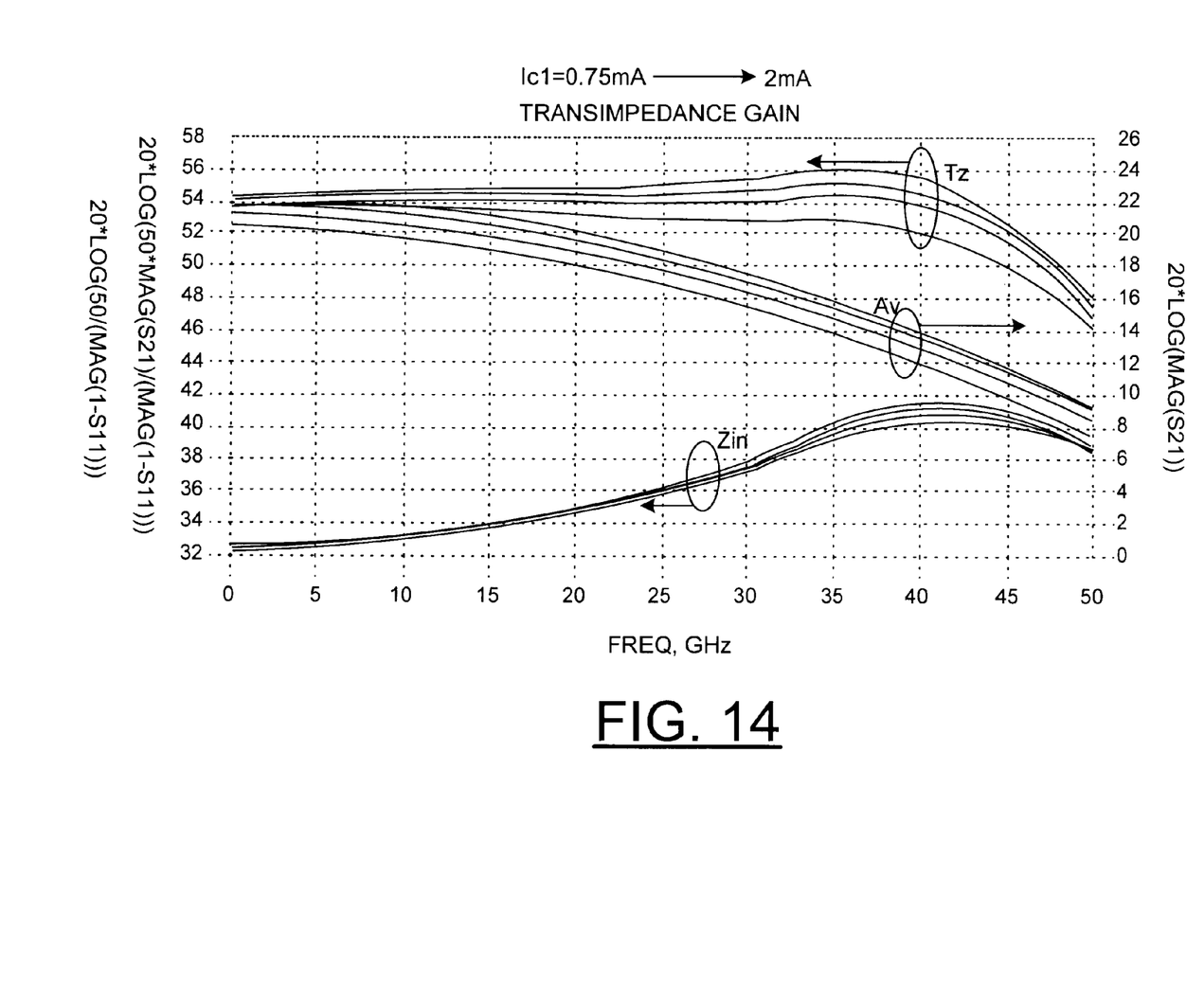
FIG. 14 illustrates a tunable bandwidth performance.

Referring to FIG. 14, a tunable transimpedance-BW performance as a function of Q1 collector bias, Ic1 is shown. Transimpedance is generally:; defined as the product of input impedance and voltage gain or Tz(dB-$\Omega$)=Zin(dB-$\Omega$)+Av(dB). FIG. 14 further illustrates the effect of tuning the current Ic1 of the common-base input stage 104. As current (e.g., Ic1) is increased, the input impedance (e.g., Zin) increases (e.g., becomes more inductive) while the voltage gain and bandwidth (e.g., Tz) also increases. This results in increased transimpedance and bandwidth. However, too high a collector current may result in undesirable small-signal Tz peaking and large-signal overshoot distortion. Therefore, it is generally desirable to operate the CB stage 104 at moderate collector bias currents Ic1. A nominal value for the collector bias current Ic1 of the present invention may be 1.5 mA. However, the circuit 104 may be configured to operate at a collector bias current range of 0.25 mA to 3.0 mA and preferably in a range of 0.75 mA to 2.5 mA.

Figure 15:
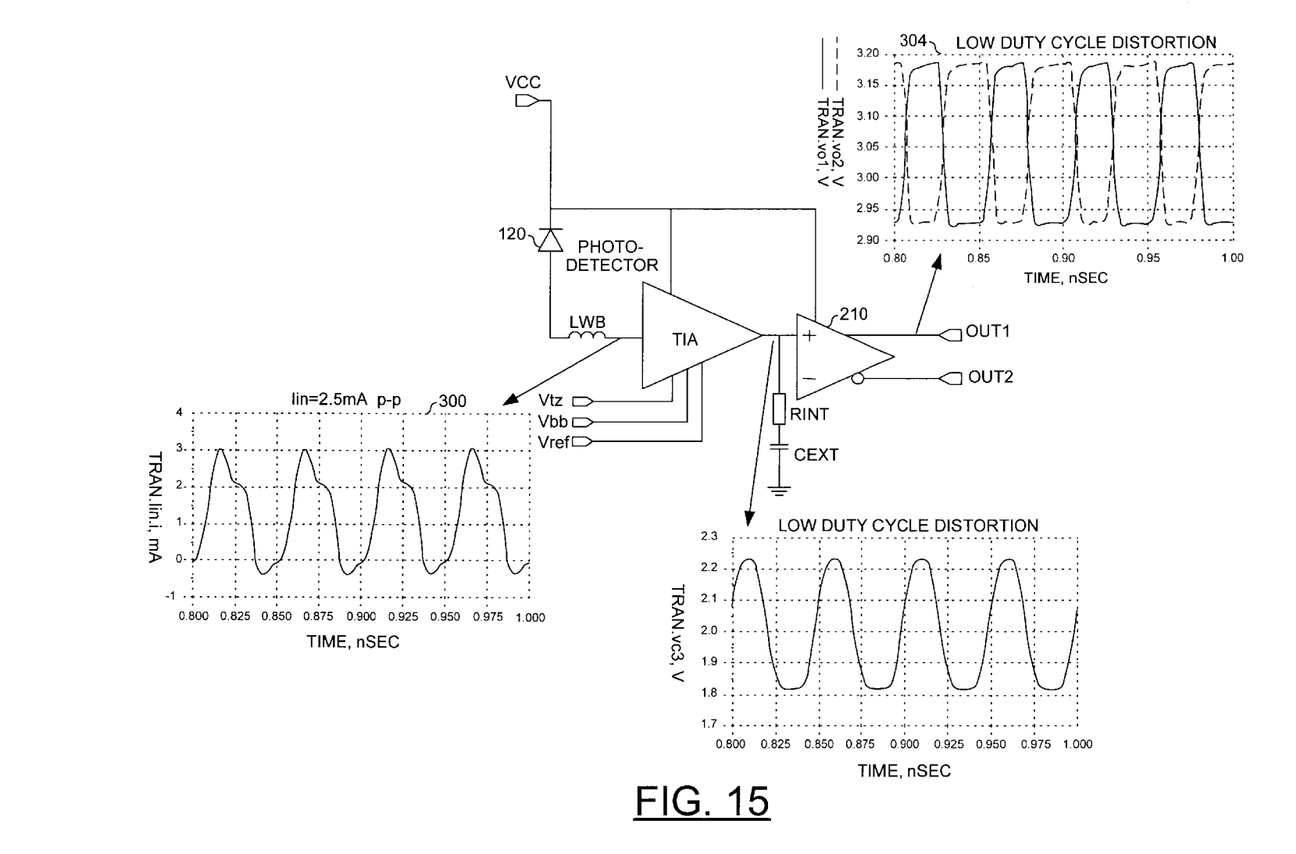
FIG. 15 illustrates an Overload Performance with an input current Iin=2.5 mA p-p for the common-base design of the present invention (Ic1=1.5 mA).

Referring to FIG. 15, an Overload Performance with an input current Iin=2.5 mA p-p CB Design of the present invention (Ic1=1.5 mA) is shown. The waveform 300 illustrates an input IN or Iin (e.g., the photodiode current Ipd-peak). The waveform 302 illustrates low duty cycle distortion at the output OUT of the TIA. The waveform 304 illustrates low duty cycle distortion at the output OUT1 of the limiting stage.

The transistors described herein may be implemented as bipolar junction transistors (BJTs) (or heterojunction bipolar transistors (HBTs)). However, other transistors with similar characteristics may be implemented to meet the design criteria of a particular implementation. In particular, the various transistors of the present invention may be implemented using a variety of process technologies. For example, any or all of Silicon Germanium (SiGe), Indium Gallium Phosphorous (InGaP), Indium Phosphide (InP), or Gallium Arsenide (GaAs) may be used. However, other process technologies may be implemented to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a common-base amplifier circuit configured to generate an output signal having a transimpedance bandwidth in response to an input signal; and
   a control circuit (i) coupled between said output signal and said input signal and (ii) configured to implement input signal control to provide input overload current capability, wherein said transimpedance in tuned in response to said control signal.

2. The apparatus according to claim 1, wherein said control circuit is configured to respond to a feed back of said output signal.

3. The apparatus according to claim 2, wherein said apparatus further comprises;
   an input circuit configured between said control circuit and said amplifier.

4. The apparatus according to claim 3, wherein said input circuit comprises a transistor configured to present said input signal to said amplifier in response to an optical devico.

5. The apparatus according to claim 4, wherein said transistor is configured to maintain a common-base collector bias current at said input of said amplifier to minimize duty cycle distortion.

6. The apparatus according to claim 1, wherein said apparatus further comprises:
   a circuit configured (i) between said amplifier and said control circuit and (ii) to provide detection/integration.

7. The apparatus according to claim 1, wherein said control circuit comprises:
   a first transistor configured to respond to a feedback of said output signal to provide said overload current capability; and
   a second transistor configured to respond to a control signal to provide tuning of said transimpedance bandwidth.

8. The apparatus according to claim 1, wherein said amplifier comprises a single-ended common-base transimpedance amplifier.

9. The apparatus according to claim 8, wherein said amplifier is configured to receive said input from an optical device.

10. The apparatus according to claim 9, wherein said optical device comprises a photo-detector.

11. The apparatus according to claim 1, wherein said apparatus is configured to maintain a common-base collector bias current at said input of said amplifier to minimize duty cycle distortion.

12. The apparatus according to claim 11, wherein said apparatus is configured to provide said minimized duty cycle distortion while maintaining sensitivity bandwidth and power consumption parameters.

13. An apparatus comprising:
   means for generation an output signal having a transimpedance bandwidth n response to an input signal; and
   means coupled between said output signal and said input signal for implementing input signal control to provide input overload current capability, wherein said transimpedance is tuned in response to said control signal.

14. A method for controlling an amplifier comprising the steps of:
   (A) generating an output signal having a transimpedance bandwidth in response to an input signal; and
   (B) controlling a bias current to minimize duty cycle distortion to provide input overload current capability, wherein said transimpedance is tuned in response to said control signal.

15. The method according to claim 14, wherein step (B) responds to:
   a feedback of said output signal to provide said overload current capability; and
   a control signal to provide tuning of said transimpedance response.

16. The method according to claim 14, wherein said method maintains a common-base collector bias on said input signal to minimize said duty cycle distortion.

17. An apparatus comprising:
   a common-base amplifier circuit configured to generate an output signal having a transimpedance bandwidth in response to an input signal;
   a control circuit (i) coupled between said output signal and said input signal and (ii) configured to implement input signal control to provide input overload current capability, wherein said control circuit comprises (a) a first transistor configured to respond to a feedback of said output signal to provide said overload current capability and (b) a second transistor configured to respond to a control signal to provide tuning of said transimpedance bandwidth.

18. The apparatus according to claim 1, wherein said control circuit is configured to respond to a feedback of said output signal.

19. The apparatus according to claim 17, wherein said transimpedance is tuned in response to said control signal.

* * * * *